(12) United States Patent
Huang et al.

(10) Patent No.: US 10,871,264 B2
(45) Date of Patent: Dec. 22, 2020

(54) DUAL CCT AUTOMOTIVE HEADLIGHT

(71) Applicant: Lumileds Holding B.V., Schiphol (NL)

(72) Inventors: Ying Huang, Aachen (DE); Colin Huang, Aachen (DE); Jimmy Xiao, Shanghai (CN); Bao Wang, Aachen (DE); Benno Spinger, Aachen (DE)

(73) Assignee: Lumileds Holding B.V.

( * ) Notice: Subject to any disclaimer, the term of this patent is extended or adjusted under 35 U.S.C. 154(b) by 0 days.

(21) Appl. No.: 16/712,465

(22) Filed: Dec. 12, 2019

(65) Prior Publication Data
US 2020/0191349 A1 Jun. 18, 2020

(30) Foreign Application Priority Data

Dec. 13, 2018 (WO) ................ PCT/CN2018/120841
Jan. 16, 2019 (EP) ..................................... 19152118

(51) Int. Cl.
| | |
|---|---|
| *F21V 21/00* | (2006.01) |
| *F21S 41/125* | (2018.01) |
| *F21S 41/32* | (2018.01) |
| *F21S 41/141* | (2018.01) |
| *F21Y 115/10* | (2016.01) |

(52) U.S. Cl.
CPC ........... *F21S 41/125* (2018.01); *F21S 41/141* (2018.01); *F21S 41/322* (2018.01); *F21Y 2115/10* (2016.08)

(58) Field of Classification Search
CPC ...... F21S 41/125; F21S 41/322; F21S 41/141; F21S 41/153; F21S 41/285; F21Y 2115/10

USPC ...... 362/545, 520, 511, 510, 311.02, 311.01, 362/230, 231
See application file for complete search history.

(56) References Cited

U.S. PATENT DOCUMENTS

| | | | |
|---|---|---|---|
| 7,447,416 B2* | 11/2008 | Jung ........................ | F21K 9/00 257/E25.02 |
| 9,974,136 B1 | 5/2018 | Wang | |
| 2010/0315012 A1 | 12/2010 | Kim et al. | |
| 2011/0080753 A1 | 4/2011 | Hering et al. | |
| 2013/0128603 A1 | 5/2013 | Chen | |
| 2015/0277020 A1 | 10/2015 | Chen | |
| 2015/0338048 A1 | 11/2015 | Ahn et al. | |
| 2018/0261738 A1* | 9/2018 | Cha ........................ | H01L 33/58 |

FOREIGN PATENT DOCUMENTS

| CN | 202140941 U | 2/2012 |
|---|---|---|
| CN | 205619189 U | 10/2016 |
| CN | 106641968 A | 5/2017 |

(Continued)

OTHER PUBLICATIONS

EP 19152118.6, "Extended EP Search Report," dated Jul. 23, 2019, 11 pages.

*Primary Examiner* — Laura K Tso

(57) ABSTRACT

A dual CCT automotive headlight is described herein, comprising: at least one first LED configured to emit light of a first color; at least one second LED configured to emit light of a second color different from the first color; a light mixing device arranged to receive and mix light from the at least one first LED and the at least one second LED and to emit the mixed light. The dual CCT automotive headlight can not only provide homogeneous light of the first color and homogeneous light of the second color, but can also provide homogeneous light of a mixed color.

13 Claims, 2 Drawing Sheets

(56) References Cited

FOREIGN PATENT DOCUMENTS

| | | |
|---|---:|---:|
| CN | 207262322 U | 4/2018 |
| CN | 108834261 A | 11/2018 |
| CN | 208332131 U | 1/2019 |
| DE | 60305095 | 12/2006 |
| DE | 102009010508 A1 | 10/2009 |
| DE | 102010056313 A1 | 6/2012 |
| DE | 102014007150 A1 | 11/2015 |
| EP | 2161494 A1 | 3/2010 |
| EP | 2408265 A2 | 1/2012 |
| WO | 2015081974 A1 | 6/2015 |

\* cited by examiner

DUAL CCT AUTOMOTIVE HEADLIGHT

CROSS REFERENCE TO RELATED APPLICATIONS

This application claims priority to International Application No. PCT/CN2018/120841 filed Dec. 13, 2018 and titled "DUAL CCT AUTOMOTIVE HEADLIGHT," and European Patent Application No. 19152118.6 filed on Jan. 16, 2019, and titled "DUAL CCT AUTOMOTIVE HEADLIGHT." Both PCT/CN2018/120841 and EP 19152118.6 are incorporated herein by reference.

TECHNICAL FIELD

This disclosure relates to a field of automotive lighting, and specifically to a dual CCT automotive headlight.

BACKGROUND

Vehicles may experience various uncertain weather and environments while driving, and headlights are closely relevant to safe driving in different weather and environments. For example, in an environment with good weather but dark areas, light with a high CCT (correlated color temperature), such as cool white light with 6000 K CCT, is usually required, but in an environment with rain or fog, light with a low CCT (e.g. warm white light with 3000 K CCT) is usually required. Such light with a low CCT has a stronger penetrating power, allowing the driver to see clearer and farther in rainy or foggy weather.

With the development of LED technology, LEDs are gradually being used in the automotive headlights. In order to allow the driver to cope with different environmental changes, two types of LEDs that respectively emit light with different CCT are usually arranged in a headlight. However, this may cause the headlight becoming bulky, and/or the light-emitting area of the headlight to be too large, and may also cause the light of each color emitted by the headlight to be inhomogeneous.

SUMMARY

A general object of the present disclosure is to provide a dual CCT automotive headlight which could overcome the above-mentioned and other possible drawbacks at least partly.

According to the present disclosure, there is provided a dual CCT automotive headlight, which comprises: at least one first LED configured to emit light of a first color; at least one second LED configured to emit light of a second color different from the first color; a light mixing device arranged to receive and mix light from the at least one first LED and the at least one second LED and to emit the mixed light.

This is advantageous in that the dual CCT automotive headlight cannot only provide homogeneous light of the first color and homogeneous light of the second color respectively, but also could provide homogeneous light of a mixed color (i.e. another color different from the first and second color).

Further, the light mixing device comprises: a body made of a material having a higher refractive index than air. The body comprises scattering particles distributed within the material. The outer surface of the body comprises a light incident area and a light emergent area, and the light incident area is arranged to receive the light from the at least one first LED and the at least one second LED. The material and the scattering particles are arranged for mixing the received light and emitting the mixed light from the light emergent area. Therefore, an efficient light mixing device is provided which is particularly suitable for use in an automotive headlight.

Further, the light emergent area is smaller than the light incident area, which could facilitate to convert a larger light-emitting area of the light source (i.e. LEDs) into a smaller light-emitting area suitable for use in an automotive headlight.

In an embodiment, the light emergent area could have a rectangle shape with a length ranging from 3.8 mm to 4.4 mm and a width ranging from 1.1 mm to 1.7 mm. Thus, the size of the light emergent area is comparable to the size of a conventional halogen filament, so that the headlight can be used more widely.

In an embodiment, a cross-sectional shape of the body along a direction from the light emergent area to the light incident area is axisymmetric, which enables the light mixing device to provide a better light mixing effect. As an example, the cross-sectional shape of the body along a direction from the light emergent area to the light incident area is an isosceles trapezoid.

In an embodiment, the light mixing device can further comprise a reflector, which is provided on an area of the outer surface of the body between the light emergent area and the light incident area. The reflector can be configured to reflect light incident thereon back into the body, thereby reducing light loss and enhancing the light mixing effect in the body. As an example, the reflectivity of the reflector is greater than 95%.

In an embodiment, the transmittance of the body is greater than 75%, which can be achieved by controlling the proportion of scattering particles distributed in the material, for example.

In an embodiment, the dual CCT automotive headlight can further comprise a controller empowered via an external switch. The controller can be configured to control the at least one first LED and the at least one second LED to emit light at the same time, so as to provide light of a mixed color.

In an embodiment, the light of the first color can comprise cool white light and the light of the second color can comprise amber light. In this case, the light of the first color and the light of the second color can be mixed to generate warm white light. As an example, in order to facilitate the generation of warm white light suitable for automotive lighting, the luminous flux of the cool white light can range from 1080 to 1320 lumens, and the luminous flux of the amber light can range from 135 to 165 lumens.

In an embodiment, the dual CCT automotive headlight can comprise a plurality of first LEDs and a plurality of second LEDs arranged in an array, where the first LEDs can alternate with the second LEDs. With this arrangement, the light emitted by the plurality of first LEDs and the plurality of second LEDs can be more homogeneous, thereby achieving a better light mixing effect.

In an embodiment, the light emergent area of the body can be smaller than a light emitting area of the array, in order to enable a conversion of a larger light-emitting area of the light source (i.e. LEDs) into a smaller light-emitting area suitable for use in an automotive headlight.

These and other advantages of the disclosure will be apparent from and elucidated with reference to the embodiments described hereinafter.

BRIEF DESCRIPTION OF THE DRAWINGS

The disclosure will now be described in more detail and with reference to the appended drawings in which.

DETAILED DESCRIPTION

The present disclosure will now be described more fully with reference to the accompanying drawings, in which currently preferred embodiments of the disclosure are shown. The disclosure may, however, be embodied in many different forms and should not be construed as limited to the embodiments set forth herein; rather, these embodiments are provided for thoroughness and completeness, and fully convey the scope of the invention to the person skilled in the art. Like reference numbers refer to like elements throughout. It is also intended that the terminology used in this disclosure be interpreted in its broadest reasonable manner, even though it is being used in conjunction with a detailed description of certain embodiments of the disclosure.

Figure 1:
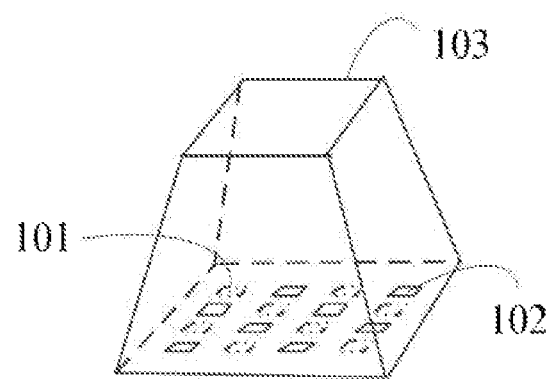
FIG. 1 illustrates a dual CCT automotive headlight according to an embodiment of the disclosure.

FIG. 1 illustrates a dual CCT automotive headlight 100 according to an embodiment of the disclosure. As shown, the dual CCT automotive headlight 100 comprises at least one first LED 101, at least one second LED 102, and a light mixing device 103. Each first LED 101 is configured to emit light of a first color, and each second LED 102 is configured to emit light of a second color different from the first color. The light mixing device 103 is arranged to receive and mix light from the at least one first LED 101 and the at least one second LED 102 and to emit the mixed light.

It should be noted that the light mixing device 103 cannot only mix light of a single color to generate homogeneous light of the single color, but can also mix light of two different colors to generate homogeneous light of a mixed color. As an example, the light of the first color can be cool white light, the light of the second color can be amber light, and the light of the mixed color can be warm white light. The at least one first LED 101 and the at least one second LED 102 may be disposed on a heat dissipation substrate. The light mixing device 103 may be arranged above the at least one first LED 101 and the at least one second LED 102 and also fixed on the heat dissipation substrate.

In an embodiment, the dual CCT automotive headlight 100 comprises a plurality of first LEDs 101 and a plurality of second LEDs 102. The plurality of first LEDs 101 and the plurality of second LEDs 102 can, for example, be arranged in an array in which the first LEDs 101 alternate with the second LEDs 102, as shown in FIG. 1. With this arrangement, the light emitted by the plurality of first LEDs 101 and the plurality of second LEDs 102 can be more homogeneous, thereby achieving a better light mixing effect. Of course, this arrangement is not limiting and other arrangements are also contemplated.

Figure 2:
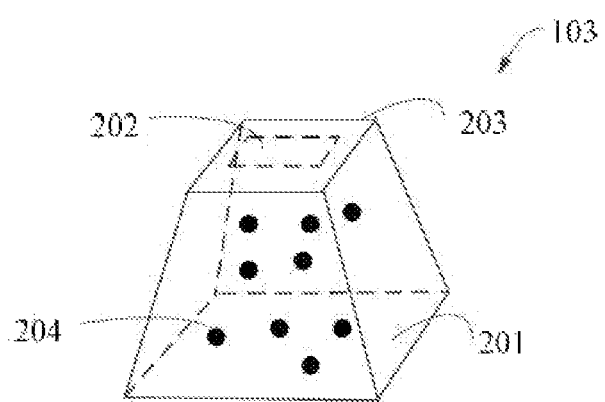
FIG. 2 is a schematic structural view of a light mixing device used in the dual CCT automotive headlight according to an embodiment of the disclosure.

FIG. 2 is a schematic structural view of a light mixing device 103 used in the dual CCT automotive headlight according to an embodiment of the disclosure. As shown in FIG. 2, the light mixing device 103 comprises a body 203. The outer surface of the body 203 comprises a light incident area 201 and a light emergent area 202. The light incident area 201 is arranged to receive the light from the at least one first LED 101 and the at least one second LED 102.

In the case where the dual CCT automotive headlight 100 comprises a plurality of first LEDs 101 and a plurality of second LEDs 102 arranged in an array, the light emergent area 202 of the body 203 can be smaller than a light emitting area of the array, in order to enable a conversion of a larger light-emitting area of the light source (i.e. LEDs) into a smaller light-emitting area suitable for use in an automotive headlight.

The body 203 is made of a material having a higher refractive index than air to enhance extraction of light from the LEDs. The body 203 also comprises scattering particles 204 distributed within the material to scatter the light extracted from the LEDs. The material and the scattering particles 204 cooperate to mix the received light and emit the mixed light from the light emergent area 202. As an example, the material can comprise, but is not limited to, silicon; and the scattering particles 204 can comprise, but are not limited to, titanium dioxide (TiO2) particles or air bubbles.

As an example, titanium dioxide particles can be randomly distributed in the material, so that the transmittance of the body 203 can be greater than 75%. For example, the weight of titanium dioxide particles distributed in the material can be fifty times less than the weight of the material to achieve such a transmittance and a better light mixing effect.

Further, the light emergent area 202 is smaller than the light incident area 201, which could facilitate a conversion of a larger light-emitting area of the light source (i.e. LEDs) into a smaller light-emitting area suitable for use in an automotive headlight. The light emergent area 202 may have various shapes such as a circular shape, a rectangular shape, or the like. As an example, the light emergent area 202 has a rectangle shape with a length in the range of 3.8-4.4 mm and a width in the range of 1.1-1.7 mm. The size of the light emergent area 202 thus is comparable to the size of a conventional halogen filament, so that the headlight can be used more widely. The size of the light incident area 201 may be set as needed, and is typically set to be greater than or equal to the size of the light emitting region of the LED light source (i.e. the at least one first LED 101 and the at least one second LED 102).

Figure 3:
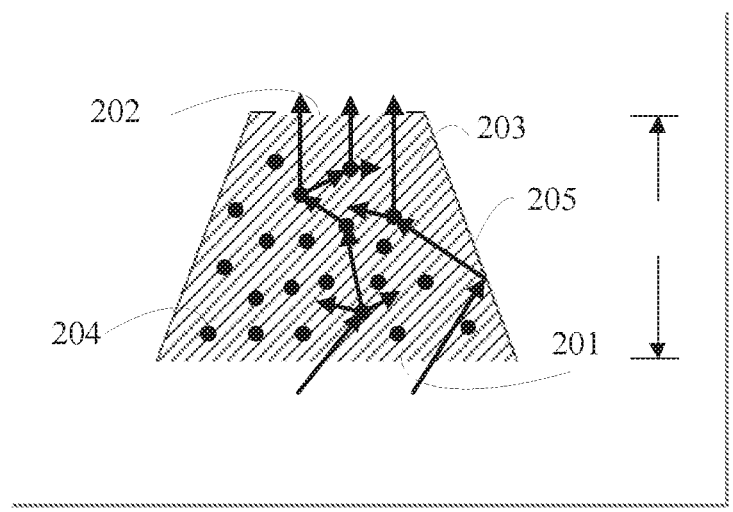
FIG. 3 is a sectional view of the light mixing device of FIG. 2 according to an embodiment of the disclosure.

The body 203 can also have various shapes, which are not limited herein. In an embodiment, a cross-sectional shape of the body 203 along a direction from the light emergent area 202 to the light incident area 201 is axisymmetric. As an example, FIG. 3 shows a sectional view of the light mixing device 103 of FIG. 2, where the cross-sectional shape of the body 203 along a direction from the light emergent area 202 to the light incident area 201 is shown as an isosceles trapezoid. Such a shape of the light mixing device 103 can provide a better light mixing effect. In an instance, the isosceles trapezoid may have a height h of less than 2 mm, which makes the light mixing device lighter and thinner and thus suitable for use in an automotive headlight.

As shown in FIG. 3, the light mixing device 103 can further comprise a reflector 205 provided on an area of the outer surface of the body 203 between the light emergent area 202 and the light incident area 201. The reflector 205 can be configured to reflect light incident thereon back into the body 203, thereby reducing light loss and enhancing the light mixing effect in the body 203. The reflector 205 may for example be a reflective coating on the outer surface of the body 203, a housing having a reflective inner surface, or the like. It should be noted that the reflective coating and reflective inner surface can be, for example, aluminum, copper, silver, or the like, and the housing can for example be made of plastic in order to additionally protect the body 203. The reflector 205 can be chosen such that its reflectivity is greater than 95%.

Figure 4:
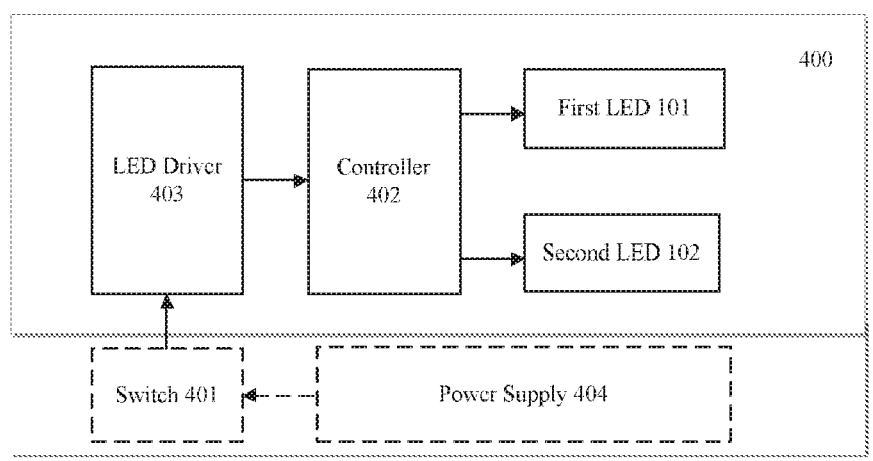
FIG. 4 is a schematic block diagram of a dual CCT automotive headlight according to another embodiment of the disclosure.

FIG. 4 is a schematic block diagram of a dual CCT automotive headlight 400 according to another embodiment of the disclosure. The dual CCT automotive headlight 400 may include at least one first LED 101, at least one second LED 102, and a light mixing device 103 (not shown), which are the same as described in FIG. 1. Additionally, the dual CCT automotive headlight 400 can include a controller 402 and an LED driver 403, as shown in FIG. 4.

The LED driver 403 can be configured to convert a current provided by an external power supply 404 into a drive current required to drive the at least one first LED 101 and the at least one second LED 102 to emit light. The controller 402 can be configured to control whether to provide the drive current to the LEDs, and the controller 402 itself can be empowered via an external switch 401, for example. The controller 402, by way of example and not limitation, may be a processor, electronic integrated circuit, application specific integrated circuit (ASIC), field programmable gate array (FPGA) or the like.

In an embodiment, the controller 402 can be configured to control the at least one first LED 101 and the at least one second LED 102 to emit light at different times, in order to generate homogeneous light of the first color and homogeneous light of the second color, respectively. As an example, the controller 402 can be configured to control the at least one first LED 101 to emit light of the first color in response to the switch 401 being turned on for the Mth time, and control the at least one second LED 102 to emit light of the second color in response to the switch 401 being turned on for the Nth time, wherein M is a positive odd number (e.g. 1, 3, 5, 7, . . . ) and N is a non-zero positive even number (e.g. 2, 4, 6, 8, . . . ). After the switch 401 is turned off for a predetermined period of time (e.g. 2 seconds), the next turn-on of the switch 401 can be determined to be the first turn-on of the switch 401. This enables switching between light of two different colors via only one switch 401, making the inventive dual CCT headlight more suitable for retrofit use in a vehicle originally only prepared for a headlight of a single color.

As an example, the light of the first color can comprise, but is not limited to, cool white light; and, the light of the second color can comprise, but is not limited to, warm white light.

In an embodiment, the controller 402 can be configured to control the at least one first LED 101 and the at least one second LED 102 to emit light at the same time, so as to provide light of a mixed color. As an example, the light of the first color can be cool white light and the light of the second color can be amber light. The cool white light and the amber light can be mixed by the light mixing device 103 to generate warm white light.

In order to generate warm white light which is more suitable for use in an environment with rain or fog, the at least one first LED 101 can be driven to emit the cool white light with a luminous flux of 1080-1320 lumens, and the at least one second LED 102 can be driven to emit the amber light with a luminous flux of 135-165 lumens, for example. In this embodiment, as an example, the controller 402 can be configured to control the at least one first LED 101 to emit light of the first color in response to the switch 401 being turned on for the Mth time, and control the at least one first LED 101 and the at least one second LED 102 to simultaneously emit light so as to generate the warm white light in response to the switch 401 being turned on for the Nth time, wherein M is a positive odd number (e.g. 1, 3, 5, 7, . . . ) and N is non-zero positive even number (e.g. 2, 4, 6, 8, . . . ). After the switch 401 is turned off for a predetermined period of time (e.g. 2 seconds), the next turn-on of the switch 401 can be determined to be the first turn-on of the switch 401. This enables an easy way to generate the warm white light, and easy switching between light of the cool white light and the warm white light via only one switch, making the headlight more suitable for use in a vehicle.

It should be noted that although the present disclosure has been described in connection with some embodiments, it is not intended to be limited to the specific form set forth herein. Rather, the scope of the present disclosure is limited only by the accompanying claims. Additionally, although individual features may be included in different claims, these may possibly be advantageously combined, and the inclusion in different claims does not imply that a combination of features is not feasible and/or advantageous. In addition, in the claims, the word "comprise" or "include" does not exclude other elements, and the indefinite article "a" or "an" does not exclude a plurality. Reference signs in the claims are provided merely as a clarifying example and shall not be construed as limiting the scope of the claims in any way.

LIST OF REFERENCE SIGNS 100, 400 dual CCT automotive headlight
101 first LED
102 second LED
103 light mixing device
201 light incident area
202 light emergent area
203 body
204 scattering particles
205 reflector
401 switch
402 controller
403 LED driver
404 power supply
h height

The invention claimed is:
1. A dual CCT automotive headlight, comprising:
at least one first LED configured to emit light of a first color;
at least one second LED configured to emit light of a second color different from the first color;
a light mixing device arranged to receive and mix light from the at least one first LED and the at least one second LED and to emit the mixed light,
wherein the light mixing device comprises:
a body made of a material having a higher refractive index than air and comprising scattering particles distributed within the material; wherein,
the outer surface of the body comprises a light incident area and a light emergent area, the light incident area being arranged to receive the light from the at least one first LED and the at least one second LED; and
the material and the scattering particles are arranged for mixing the received light and emitting the mixed light from the light emergent area,
wherein the light emergent area is smaller than the light incident area.
2. The dual CCT automotive headlight according to claim 1, wherein the light emergent area has a rectangle shape with a length ranging from 3.8 mm to 4.4 mm and a width ranging from 1.1 mm to 1.7 mm.

3. The dual CCT automotive headlight according to claim 1, wherein a cross-sectional shape of the body along a direction from the light emergent area to the light incident area is axisymmetric.

4. The dual CCT automotive headlight according to claim 3, wherein the cross-sectional shape of the body along a direction from the light emergent area to the light incident area is an isosceles trapezoid.

5. The dual CCT automotive headlight according to claim 4, wherein the isosceles trapezoid has a height (h) of less than 2 mm.

6. The dual CCT automotive headlight according to claim 1, wherein the light mixing device further comprises:
   a reflector provided on an area of the outer surface of the body between the light emergent area and the light incident area and configured to reflect light incident thereon back into the body.

7. The dual CCT automotive headlight according to claim 6, wherein the reflectivity of the reflector is greater than 95%.

8. The dual CCT automotive headlight according to claim 1, wherein the transmittance of the body is greater than 75%.

9. The dual CCT automotive headlight according to claim 1, further comprising:
   a controller configured to be empowered via an external switch, and to control the at least one first LED and the at least one second LED to emit light at the same time.

10. The dual CCT automotive headlight according to claim 9, wherein the light of the first color comprises cool white light and the light of the second color comprises amber light.

11. The dual CCT automotive headlight according to claim 10, wherein the luminous flux of the cool white light ranges from 1080 to 1320 lumens, and the luminous flux of the amber light ranges from 135 to 165 lumens.

12. The dual CCT automotive headlight according to claim 1, comprising a plurality of first LEDs and a plurality of second LEDs arranged in an array in which the first LEDs alternate with the second LEDs.

13. The dual CCT automotive headlight according to claim 12, wherein the light emergent area of the body is smaller than a light emitting area of the array.

* * * * *